United States Patent
Okabe et al.

(10) Patent No.: US 10,090,182 B2
(45) Date of Patent: Oct. 2, 2018

(54) LOAD PORT DEVICE AND CLEANING GAS INTRODUCING METHOD INTO A CONTAINER ON A LOAD PORT

(71) Applicant: TDK Corporation, Tokyo (JP)

(72) Inventors: Tsutomu Okabe, Tokyo (JP); Koichiro Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/372,883

(22) Filed: Dec. 8, 2016

(65) Prior Publication Data
US 2017/0170045 A1 Jun. 15, 2017

(30) Foreign Application Priority Data
Dec. 11, 2015 (JP) ................... 2015-242044

(51) Int. Cl.
H01L 21/677 (2006.01)
H01L 21/02 (2006.01)
H01L 21/673 (2006.01)
H01L 21/67 (2006.01)

(52) U.S. Cl.
CPC .. *H01L 21/67766* (2013.01); *H01L 21/02046* (2013.01); *H01L 21/67017* (2013.01); *H01L 21/67353* (2013.01); *H01L 21/67393* (2013.01); *H01L 21/67772* (2013.01); *H01L 21/67775* (2013.01); *B65G 2201/0297* (2013.01)

(58) Field of Classification Search
CPC ......... H01L 21/67766; H01L 21/67393; H01L 21/67772; H01L 21/67775
See application file for complete search history.

(56) References Cited

U.S. PATENT DOCUMENTS

| | | | |
|---|---|---|---|
| 7,841,371 B2* | 11/2010 | Okabe ............... | H01L 21/67017 141/51 |
| 7,942,619 B2* | 5/2011 | Hashimoto ....... | H01L 21/67766 414/217 |
| 8,522,836 B2* | 9/2013 | Okabe ............... | H01L 21/67393 141/286 |
| 8,596,312 B2* | 12/2013 | Natsume ........... | H01L 21/67775 141/63 |
| 8,950,999 B2* | 2/2015 | Tamura ............. | H01L 21/67248 414/217 |
| 8,978,718 B2* | 3/2015 | Emoto .............. | H01L 21/67017 141/51 |

(Continued)

FOREIGN PATENT DOCUMENTS

JP    2007-005607 A    1/2007

*Primary Examiner* — Kaitlin S Joerger
(74) *Attorney, Agent, or Firm* — Oliff PLC (57) ABSTRACT

A load port device includes an installation stand, an opening and closing part, a gas introduction part, and a gas discharge part. The installation stand installs a container whose side surface has a main opening for taking in and out a wafer. The opening and closing part opens and closes the main opening. The gas introduction part introduces a cleaning gas from the main opening into the container. The gas discharge part has a bottom nozzle capable of communicating with a bottom hole formed at a position distant from the main opening more than a bottom surface middle on a bottom surface of the container. The gas discharge part is capable of discharging a gas in the container to an outside of the container.

8 Claims, 7 Drawing Sheets

(56) References Cited

U.S. PATENT DOCUMENTS

| | | | |
|---|---|---|---|
| 9,010,384 B2* | 4/2015 | Yoshimura | H01L 21/67772 |
| | | | 141/63 |
| 9,153,468 B2* | 10/2015 | Emoto | H01L 21/67772 |
| 2007/0023322 A1* | 2/2007 | Hyun | H01L 21/67017 |
| | | | 206/711 |
| 2010/0175781 A1* | 7/2010 | Kisakibaru | H01L 21/67017 |
| | | | 141/98 |
| 2015/0214078 A1* | 7/2015 | Iwamoto | H01L 21/67772 |
| | | | 414/304 |
| 2015/0235885 A1* | 8/2015 | Iwamoto | H01L 21/67389 |
| | | | 53/86 |
| 2016/0038982 A1* | 2/2016 | Sasaki | H01L 21/67775 |
| | | | 15/316.1 |
| 2016/0260628 A1* | 9/2016 | Ochiai | H01L 21/67772 |
| 2016/0276189 A1* | 9/2016 | Igarashi | H01L 21/67775 |
| 2016/0351427 A1* | 12/2016 | Murata | B08B 5/04 |
| 2016/0358799 A1* | 12/2016 | Murata | H01L 21/67389 |
| 2017/0025298 A1* | 1/2017 | Iwamoto | B08B 5/00 |
| 2017/0025299 A1* | 1/2017 | Sasaki | B08B 9/08 |
| 2017/0170033 A1* | 6/2017 | Okabe | H01L 21/67017 |
| 2017/0170043 A1* | 6/2017 | Oh | H01L 21/302 |
| 2017/0178942 A1* | 6/2017 | Sakata | H01L 21/67778 |

* cited by examiner

LOAD PORT DEVICE AND CLEANING GAS INTRODUCING METHOD INTO A CONTAINER ON A LOAD PORT

BACKGROUND OF THE INVENTION

1. Field of the Invention

The present invention relates to a load port device where a container housing a wafer is installed at the time of processing the wafer and a cleaning gas introducing method into the container on the load port device.

2. Description of the Related Art

In manufacturing steps of semiconductors, wafers are transported between respective processing apparatuses using a container called a FOUP or so. When the wafers are processed, the container is installed on an installation stand of a load port device mounted on respective processing apparatuses, and the load port device communicates between a space in a transport container and a space in a processing room. This makes it possible to take out the wafers from the transport container using a robot arm or so and deliver the wafers to the processing room.

In the environment of a container housing wafers, it is preferred to maintain an inactive state and a cleanliness that exceed a predetermined level so as to protect the surfaces of the wafers from oxidation and contamination. As a method for improving an inactive state and a cleanliness of a gas in the transport container, Patent Document 1 proposes a load port apparatus introducing a cleaning gas into a transport container via a bottom hole formed on the bottom surface of the transport container.

Patent Document 1: JP 2007-5607A

SUMMARY OF THE INVENTION

As a result of miniaturization of semiconductor circuits, a higher cleanliness has been also recently demanded in the internal environment of the container housing the wafers so as to protect the wafer surfaces from oxidation and contamination. In the course of development for a load port maintaining a clean environment of the wafer container, it turned out that there is a problem that the wafer surface before or after processing to be housed in the container is contaminated by an outgas generated from the wafers soon after being processed, and that this contributes to prevention from improvement in quality.

The prevent invention has been achieved under such circumstances and provides a load port device and a cleaning gas introducing method into a container on the load port capable of maintaining a clean environment in a container and protecting a wafer surface from oxidation and contamination.

To achieve the above object, the load port device according to the present invention includes:

an installation stand configured to install a container whose side surface has a main opening for taking in and out a wafer;

an opening and closing part configured to open and close the main opening;

a gas introduction part configured to introduce a cleaning gas from the main opening into the container; and a gas discharge part configured to have a bottom nozzle capable of communicating with a bottom hole formed at a position distant from the main opening more than a bottom surface middle on a bottom surface of the container and configured to be capable of discharging a gas in the container to an outside of the container.

The load port device according to the present invention has the gas introduction part configured to introduce the cleaning gas from the main opening and the gas discharge part configured to be capable of discharging the gas in the container from the bottom hole distant from the main opening, and thus can form a current of the cleaning gas in the container and efficiently discharge an outgas generated from the wafer soon after being processed to the outside of the container. Thus, the load port device can maintain a clean environment in the container and protect the wafer surface from oxidation and contamination.

For example, the gas discharge part may include a forcible discharge means configured to forcibly discharge the gas in the container.

When the gas discharge part has the forcible discharge means, the outgas generated from the wafer can be more effectively discharged to the outside of the container.

A cleaning gas introducing method into a container on a load port device according to the present invention, including:

an installation step of installing the container whose side surface has a main opening for taking in and out a wafer on an installation stand of the load port device;

a first introduction step of introducing a cleaning gas from at least one of bottom nozzles capable of communicating with a bottom hole formed on a bottom surface of the container installed on the installation stand in a state where the main opening is closed; and a second introduction step of introducing a cleaning gas from the main opening into the container after opening the main opening and stopping an introduction of the cleaning gas from the bottom nozzle, wherein the second introduction step discharges a gas in the container to an outside of the container via at least one of the bottom nozzles capable of communicating with a bottom hole formed at a position distant from the main opening more than a bottom surface middle on the bottom surface of the container.

In the cleaning gas introducing method into the container on the load port device, the cleaning gas is introduced from the bottom hole of the container before the main opening is opened, but after the main opening is opened, the introduction of the cleaning gas from the bottom hole is stopped, and the cleaning gas is introduced from the main opening. This makes it possible to clean the environment in the container even before the main opening is opened, and to form the current of the cleaning gas in the container and efficiently discharge an outgas generated from the wafer soon after being processed to the outside of the container after the main opening is opened. Thus, the cleaning gas introducing method into the container on the load port device can maintain a clean environment in the container and protect the wafer surface from oxidation and contamination.

For example, the bottom nozzle discharging the gas in the container to the outside of the container may be connected to a forcible discharge means configured to forcibly discharge the gas in the container in the second introduction step, and the forcible discharge means may forcibly discharge the gas in the container.

When the forcible discharge means forcibly discharges the gas in the container, a strong current is formed in the container, and the outgas generated from the wafer can be effectively discharged to the outside of the container.

For example, the introduction of the cleaning gas in the first introduction step and the discharge of the gas in the second introduction step may be carried out via the same bottom nozzle.

When the introduction of the cleaning gas and the discharge of the gas from the container are carried out via the same bottom nozzle, it is possible to increase the number of introduction passages of the cleaning gas in the first introduction step, and thus quickly clean the inside of the container before the main opening is opened. It is also possible to reduce the number of bottom holes and bottom nozzles and simplify the structure of the container and the load port device.

DESCRIPTION OF THE PREFERRED EMBODIMENTS

Hereinafter, the present invention will be described based on embodiments shown in the figures.

Figure 1:
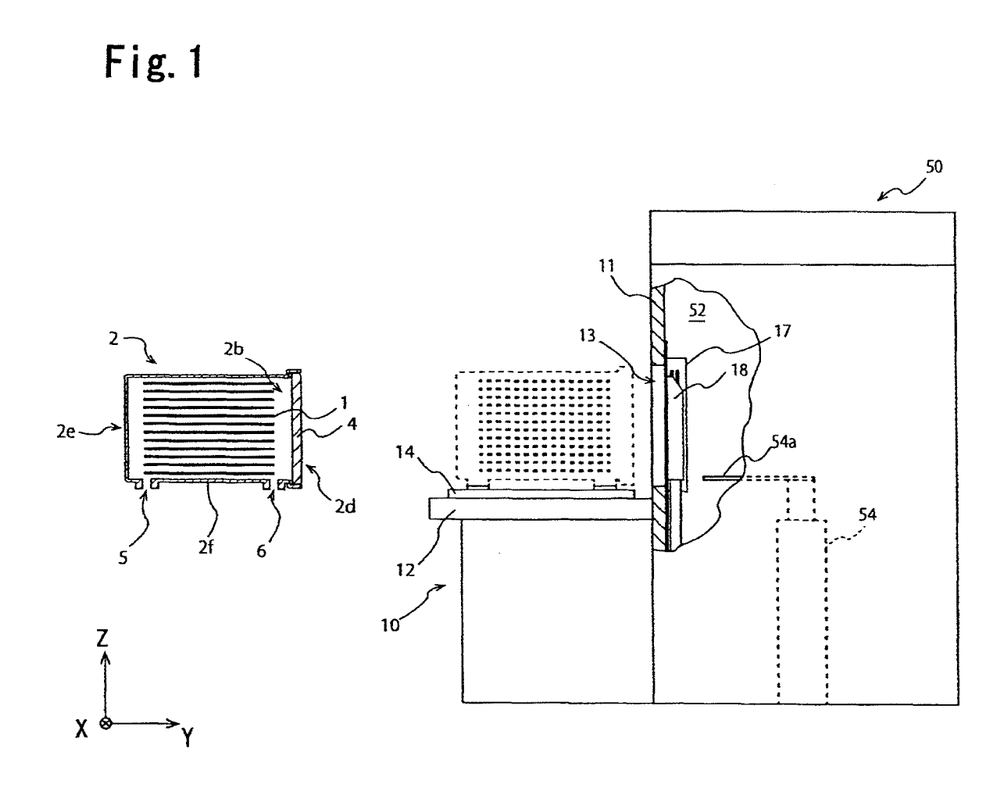
FIG. 1 is a schematic view of a load port device and a peripheral device thereof according to an embodiment of the present invention.

As shown in FIG. 1, a load port device 10 according to an embodiment of the present invention constitutes a part of an EFEM 50 of a front end module of a semiconductor processing apparatus. In addition to the load port device 10, the EFEM 50 has a minienvironment 52, a transportation robot 54, and the like. The minienvironment 52 is a space connecting a FOUP 2 as a container for transporting wafers 1 and a processing room (not shown). The transportation robot 54 is arranged in the minienvironment 52.

Figure 4:
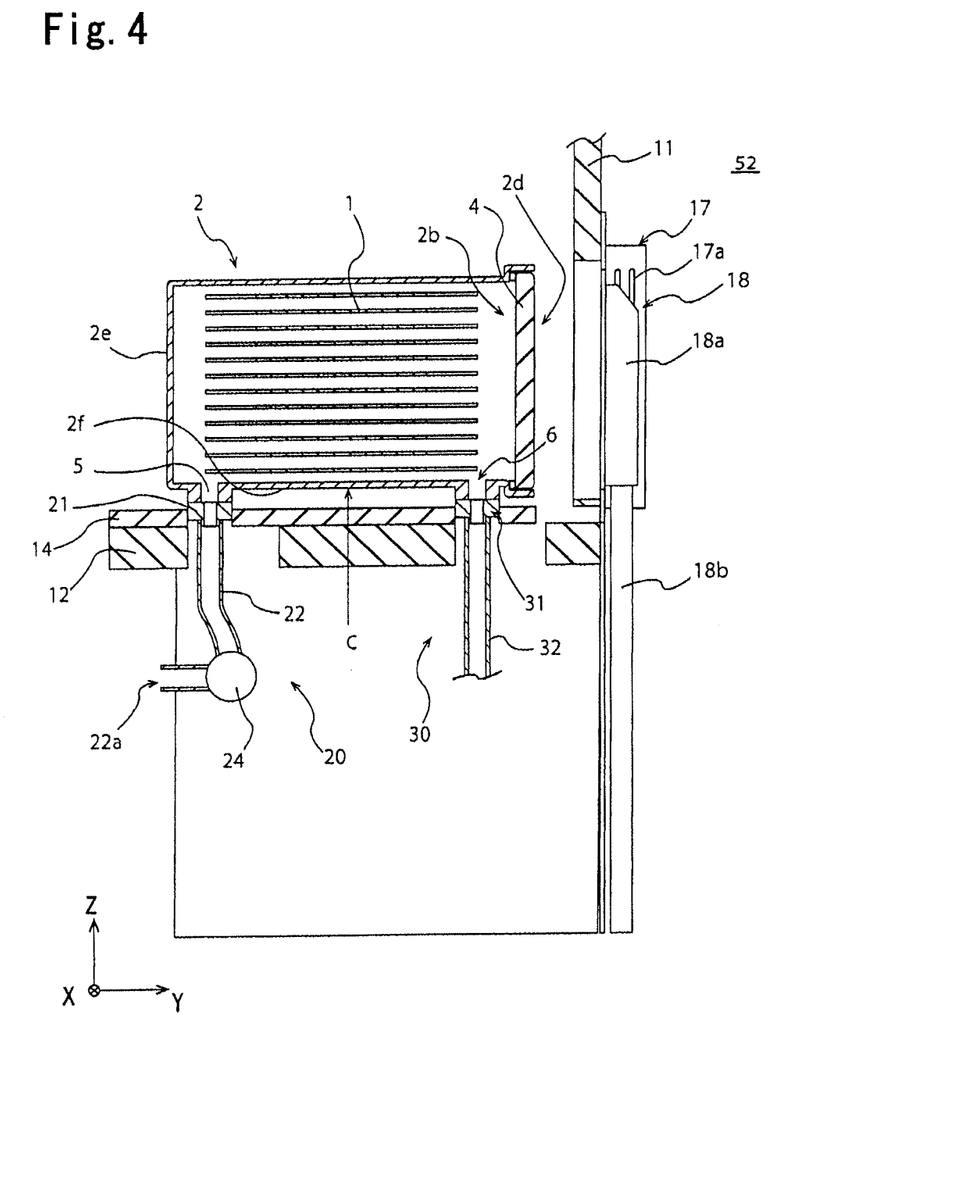
FIG. 4 is a conceptual figure showing a state of a load port device in a state where a main opening of a container is closed.

The load port device 10 has an installation stand 14 for installing the FOUP 2, an opening and closing part 18 for opening and closing the main opening 2b of the FOUP 2, and a front gas introduction part 17 for introducing a cleaning gas from the main opening 2b into the FOUP 2. As shown in FIG. 4, the load port device 10 has a gas discharge part 20 and a bottom gas introduction part 30. The gas discharge part 20 can discharge the gas in the FOUP 2 to the outside via a first bottom hole 5 formed on the FOUP 2. The bottom gas introduction part 30 introduces a cleaning gas into the FOUP 2 via a second bottom hole 6 formed on the FOUP 2.

As shown in FIG. 1, the installation stand 14 of the load port device 10 is arranged on a fixing stand 12 and is movable to the fixing stand 12 in the Y-axis direction. Incidentally, the Y-axis is a moving direction of the installation stand 14, the Z-axis is an up and down direction of a vertical direction, and the X-axis is a vertical direction to the Y-axis and the Z-axis.

The FOUP 2 for sealing a plurality of the wafers 1 as housed objects for storage and transportation can be detachably installed on the top in the Z-axis of the installation stand 14. The space for housing the wafers 1 is formed in the FOUP 2. The FOUP 2 has a box shape having a plurality of side surfaces positioned in the horizontal direction toward the inside of the FOUP 2 and a top surface and a bottom surface 2f positioned in the up and down direction. The main opening 2b for taking in and out the wafers 1 housed in the FOUP 2 is formed on a first side surface 2d. The first side surface 2d is one of the multiple side surfaces of the FOUP 2.

The FOUP 2 also has a lid 4 for sealing the main opening 2b. Shelves (not shown) for vertically overlapping the multiple wafers 1 held horizontally are arranged in the FOUP 2. Each of the wafers 1 placed on the shelves is housed in the FOUP 2 at regular intervals. The first bottom hole 5 and the second bottom hole 6 are formed on the bottom surface 2f of the FOUP 2. Structure and function of the first bottom hole 5 and the second bottom hole 6 will be described below.

The load port device 10 is an apparatus for the Front Opening Unified Pod (FOUP) 2 as shown in FIG. 1, but is also applicable to a sealed transport container having a structure where an opening for taking in and out the wafers 1 is formed on a side surface in the same manner as the FOUP 2. The EFEM 50 can open the main opening 2b formed on the side surface of the FOUP 2 using the load port device 10, and can further transport the wafers housed in the FOUP 2 to the inside of the processing room via the minienvironment 52 maintained in a clean state using the transportation robot 54. The EFEM 50 can transport the wafers 1 that have been subjected to processing in the processing room from the processing room to the inside of the FOUP 2 using the transportation robot 54, can close the main opening 2b using the load port device 10, and can house the processed wafers 1 in the FOUP 2.

Incidentally, the EFEM 50 has an air cleaning machine (not shown) for maintaining a clean state in the minienvironment 52. The air cleaning machine is not limited, and has a filter for removing dust and chemical substances contained in an air or a gas supplied to the minienvironment 52, a fan for flowing a gas so that an air or a gas passes through a passage where the filter is arranged and is supplied into the minienvironment 52, and the like.

Figure 2:
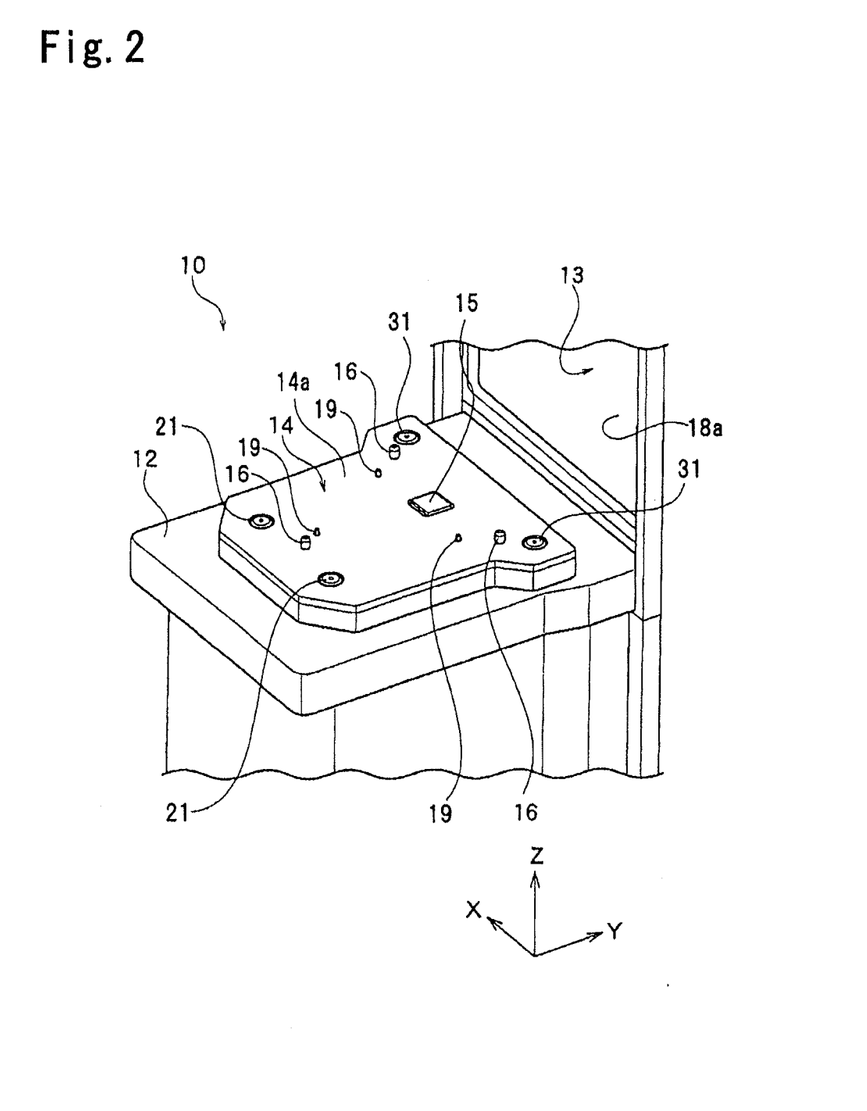
FIG. 2 is a perspective view of a main part showing a vicinity of an installation stand of the load port device shown in FIG. 1.

FIG. 2 is a perspective view of a main part showing a vicinity of the installation stand 14 of the load port device 10. One or more (preferably three) positioning pins 16 are embedded on a top surface 14a of the installation stand 14. The positioning pins 16 are engaged with positioning portions (not shown) arranged on the bottom surface 2f of the FOUP 2. This uniquely determines a positional relation of the X-axis and the Y-axis between the FOUP 2 and the installation stand 14.

Position detecting sensors 19 are arranged near the respective positioning pins 16 on the top surface 14a of the installation stand 14. The position detecting sensors 19 detect whether the FOUP 2 is positioned and arranged at a predetermined position in the X-Y axis direction on the top surface 14a of the installation stand 14. The position detecting sensors 19 are not limited, and may be contact position detecting sensors or non-contact position detecting sensors. A lock mechanism 15 for locking the FOUP 2 is provided on the top surface 14a of the installation stand 14.

Figure 3:
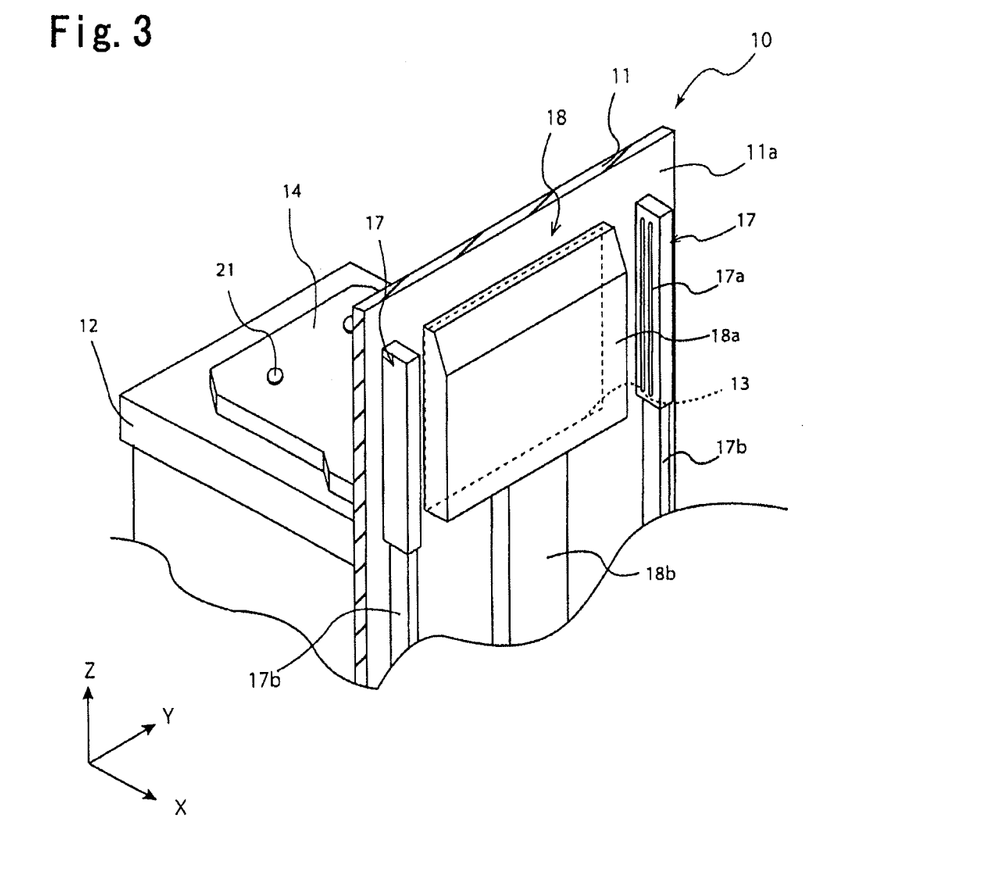
FIG. 3 is a perspective view of a main part showing a vicinity of a door of the load port device shown in FIG. 1.

FIG. 3 is a perspective view of a main part showing a vicinity of the opening and closing part 18 of the load port device 10. The opening and closing part 18 of the load port device 10 has a door 18a and a door driving part 18b. The door 18a can close a delivery port 13 formed in a wall member 11 for separating the installation stand 14 and the minienvironment 52. The door 18a can engage with the lid 4 of the FOUP 2 entered into the delivery port 13.

Figure 5:
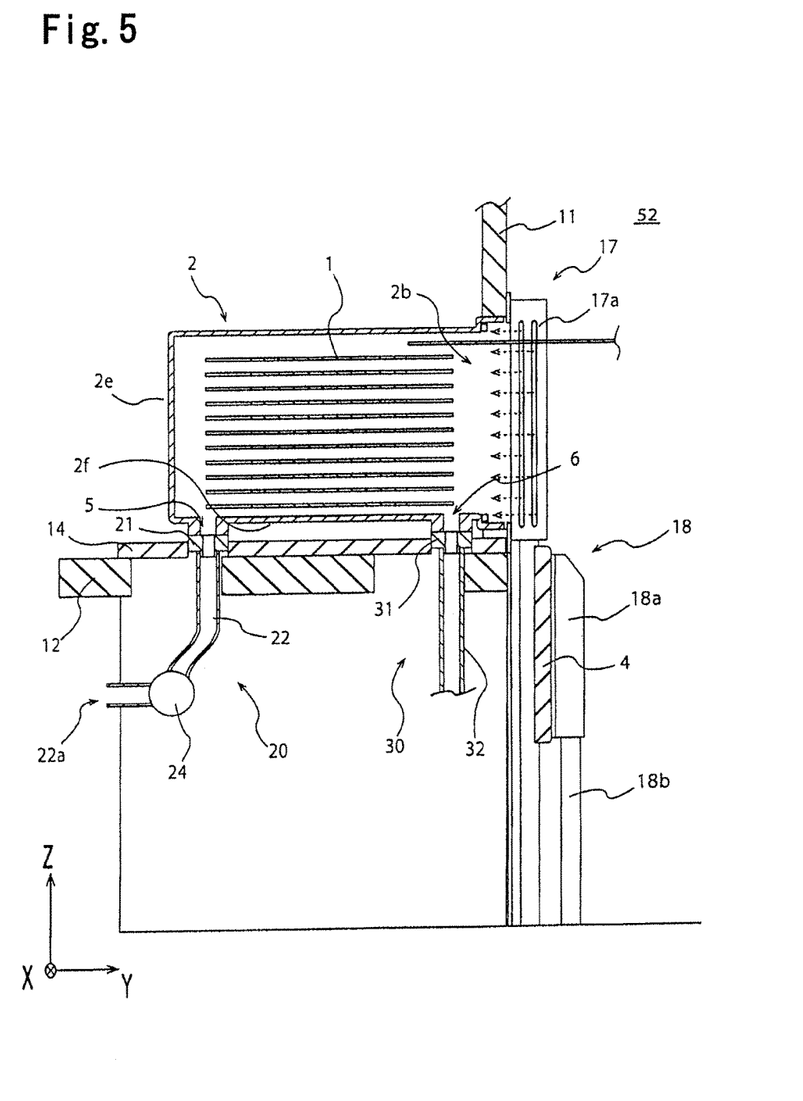
FIG. 5 is a conceptual figure showing a state of a load port device in a state where a main opening of a container is opened.

As shown in FIG. 5, the opening and closing part 18 transports the door 18a engaged with the lid 4 into the minienvironment 52 using the door driving part 18b so as to open the main opening 2b of the FOUP 2. Incidentally, the opening and closing part 18 moves the door 18a toward the opposite direction to the direction at the time of opening using the door driving part 18b and returns the lid 4 to the first side surface 2d of the FOUP 2, so that the main opening 2b can be closed by the lid 4. After the main opening 2b is closed by the lid 4, the engagement between the door 18a and the lid 4 is released.

As shown in FIG. 3, the front gas introduction parts 17 are arranged on an inner surface 11a. The inner surface 11a is a surface of the wall member 11 on the side of the minienvironment 52. The front gas introduction parts 17 are arranged on both sides in the X-axis direction sandwiching the delivery port 13 formed on the wall member 11.

The front gas introduction part 17 is connected to a supply passage 17b for supply a cleaning gas to the front gas introduction part 17. The front gas introduction part 17 is provided with blow nozzles 17a directed toward the delivery port 13. As shown in FIG. 5, the cleaning gas blown from the blow nozzles 17a of the front gas introduction part 17 is introduced into the FOUP 2 via the main opening 2b in a state where the main opening 2b of the FOUP 2 is opened and the inside of the FOUP 2 is communicated with the minienvironment 52.

As shown in FIG. 4, the gas discharge part 20 is arranged in the lower part in the Z-axis direction of the installation stand 14. The gas discharge part 20 has a first bottom nozzle 21 capable of communicating with the first bottom hole 5 formed at a position distant from the main opening 2b more than a bottom surface middle "C" on the bottom surface 2f of the FOUP 2. As shown in FIG. 2, the gas discharge part 20 has two first bottom nozzles 21. As shown in FIG. 4, each of the first bottom nozzles 21 can be respectively communicated with two first bottom holes 5 formed on the bottom surface 2f of the FOUP 2. The bottom surface middle "C" of the FOUP 2 shown in FIG. 4 means a position that is equidistant from the first side surface 2d where the lid 4 is arranged and the second side surface 2e opposing to the first side surface 2d.

The first bottom nozzles 21 are movable up and down along the Z-axis direction, and are housed in the installation stand 14 in a state where the FOUP 2 is not installed on the installation stand 14. As shown in FIG. 4, the first bottom nozzles 21 rise upward in the Z-axis direction after the FOUP 2 is fixed on the installation stand 14 and protrude from the top surface 14a of the installation stand 14 so as to connect to the first bottom holes 5 of the FOUP 2. Valves not shown for opening and closing the first bottom holes 5 are attached to the first bottom holes 5 of the FOUP 2. The valves are opened when the first bottom nozzles 21 are connected to the first bottom holes 5, and the first bottom nozzles 21 and the first bottom holes 5 are communicated with each other.

The gas discharge part 20 has a first pipe part 22 connecting to the first bottom nozzle 21 and a forcible discharge means 24 arranged on the first pipe part 22. One of end portions of the first pipe part 22 is connected to the first bottom nozzle 21, and the other end portion is connected to a discharge port 22a opening toward the outside of the load port device 10.

The forcible discharge means 24 absorbs the gas in the FOUP 2 and forcibly discharges the gas in the FOUP 2 via the first bottom hole 5 and the first bottom nozzle 21. The forcible discharge means 24 is not limited as long as the gas in the FOUP 2 can be absorbed, and may be a suction pump, an air blowing fan, or the like. Incidentally, the forcible discharge denotes a discharge for positively absorbing a gas in the FOUP 2 into the first pipe part 22.

In addition to the gas discharge part 20, the bottom gas introduction part 30 is arranged in the lower part in the Z-axis direction of the installation stand 14. The bottom gas introduction part 30 has a second bottom nozzle 31 capable of communicating with the second bottom hole 6 formed at a position nearer to the main opening 2b than to the bottom surface middle "C" on the bottom surface 2f of the FOUP 2. As shown in FIG. 2, the bottom gas introduction part 30 has two second bottom nozzles 31 capable of being exposed from the installation stand 14. As shown in FIG. 4, each of the second bottom nozzles 31 can be respectively communicated with two second bottom holes 6 formed on the bottom surface 2f of the FOUP 2.

The second bottom nozzles 31 are also movable up and down along the Z-axis direction in the same manner as the first bottom nozzles 21. Valves not shown for opening and closing the second bottom holes 6 are attached to the second bottom holes 6 of the FOUP 2, which is also the same as the first bottom holes 5.

The bottom gas introduction part 30 has a second pipe part 32 connected to the second bottom nozzle 31. A cleaning gas is supplied to the second bottom nozzle 31 via the second pipe part 32. The bottom gas introduction part 30 introduces the cleaning gas into the FOUP 2 via the second bottom hole 6 of the FOUP 2 and the second bottom nozzle 31 communicated with the second bottom hole 6.

The cleaning gas introduced from the front gas introduction part 17 and the bottom gas introduction part 30 into the FOUP 2 is not limited, and may be, for example, a nitrogen gas, another inert gas, a cleaned air where dust is removed by a filer or so, or the like.

Figure 7:
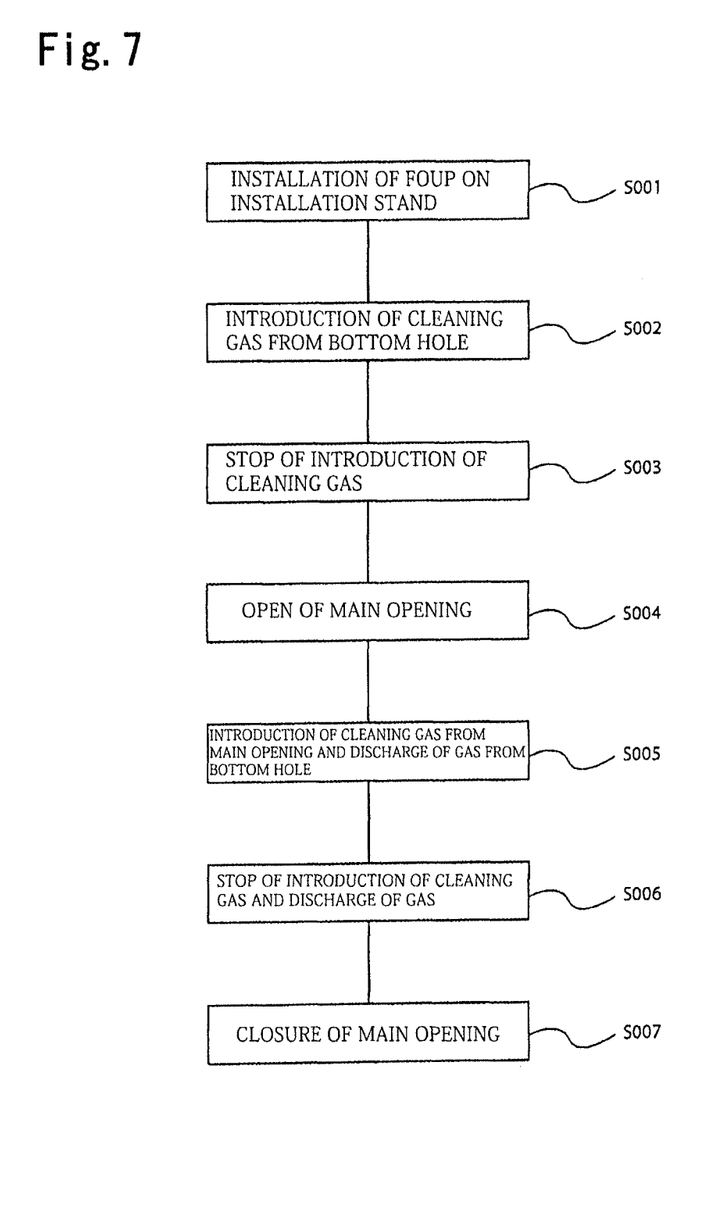
FIG. 7 is a flowchart showing a cleaning gas introducing method into the container of the load port device shown in FIG. 1.

FIG. 7 is a flowchart showing introduction steps of a cleaning gas into the FOUP 2 carried out in the load port device 10 shown in FIG. 1. Hereinafter, the introduction steps of a cleaning gas into the FOUP 2 will be described using FIG. 7 etc.

In Step S001 shown in FIG. 7, the FOUP 2 housing the wafers 1 before being processed is installed on the installation stand 14 of the load port device 10. The FOUP 2 is automatically transported to the installation stand 14 of the load port device 10 by a ceiling transport system, for example, but a method for transporting the FOUP 2 is not limited.

In an installation step of the FOUP 2 shown in Step S001, the load port device 10 drives the lock mechanism 15 so as to fix the FOUP 2 to the installation stand 14 after the position detecting sensors 19 shown in FIG. 2 confirm that the FOUP 2 is installed at an appropriate position.

After the FOUP 2 is installed on the installation stand 14 (Step S001), the step shown in Step S002 (see FIG. 7) begins, and the load port device 10 introduces the cleaning gas from the second bottom holes 6 of the FOUP 2 into the FOUP 2.

As shown in FIG. 4, in Step S002, the load port device 10 raises the second bottom nozzles 31 of the bottom gas introduction part 30 so as to respectively communicate the two second bottom nozzles 31 with the two second bottom holes 6 arranged on the FOUP 2. Furthermore, the load port device 10 carries out a first introduction step of supplying the cleaning gas from the second pipe part 32 of the bottom gas introduction part 30 to the second bottom nozzles 31 and introducing the cleaning gas into the FOUP 2 via the second bottom holes 6.

In Step S002, the load port device 10 raises the first bottom nozzles 21 of the gas discharge part 20 so as to communicate them with the two first bottom holes 5 arranged on the FOUP 2 at the same time as the rising of the second bottom nozzles 31 or before or after the rising of the second bottom nozzles 31. This makes it possible to discharge the gas in the FOUP 2 to the outside of the FOUP 2 via the first bottom nozzles 21 and makes it possible to more smoothly introduce the cleaning gas from the second bottom nozzles 31 to the FOUP 2.

In Step S002, the cleaning gas is introduced in a state where the main opening 2b of the FOUP 2 is closed by the lid 4. However, the introduction of the cleaning gas into the FOUP 2 using the second bottom nozzles 31 may be continued to the beginning of a cleaning gas introduction from the front gas introduction parts 17 into the FOUP 2 (Step S005) even after the main opening 2b of the FOUP 2 is opened.

Next, in Step S003 (see FIG. 7), the load port device 10 stops the introduction of the cleaning gas into the FOUP 2 via the second bottom holes 6 and the bottom gas introduction part 30. The load port device 10 stops the introduction of the cleaning gas into the FOUP 2 by stopping the supply of the cleaning gas from the second pipe part 32 to the second bottom nozzles 31. Incidentally, the communication state between the second bottom nozzles 31 and the second bottom holes 6 may be released by lowering the second bottom nozzles 31, or may be maintained in the same manner as when the cleaning gas is being introduced. This is the case with the communication state between the first bottom nozzles 21 and the first bottom holes 5.

Step S003 is carried out at any time, and for example, may be carried out at a time when an introduction time of the cleaning gas from the second bottom nozzles 31 reaches a predetermined time, or may be carried out at a time when the fact that a cleanliness of the gas discharged from the FOUP 2 reaches a predetermined level is detected.

Incidentally, the load port device 10 moves the installation stand 14 in the Y-axis direction (positive direction) so as to move the FOUP 2 fixed on the installation stand 14 to a position where the first side surface 2d of the FOUP 2 enters the delivery port 13 in parallel with the introduction and stop steps of the cleaning gas shown in Step S002 and Step S003 or before the introduction of the cleaning gas or after the stop of the introduction of the cleaning gas (see FIG. 5).

In Step S004 (see FIG. 7), the load port device 10 opens the main opening 2b of the FOUP 2. In Step S004, the load port device 10 engages the door 18a of the opening and closing part 18 with the lid 4 of the FOUP 2 moved to the position shown in FIG. 5 in advance. Furthermore, the door 18a is moved by the door driving part 18b so as to remove the lid 4 from the portion where the wafers are housed in the FOUP 2 and open the main opening 2b. The removed lid 4 is moved along with the door 18a to a position where the transportation of the wafers 1 by the transportation robot 54 is not disturbed.

Next, in Step S005 (see FIG. 7), the load port device 10 carries out a second introduction step of introducing a cleaning gas from the main opening 2b into the FOUP 2 and discharging a gas in the FOUP 2 via the first bottom holes 5 formed at a position distant from the main opening 2b more than the bottom surface middle "C". As shown in FIG. 5, the load port device 10 injects the cleaning gas from the blow nozzles 17a of the front gas introduction parts 17 toward the main opening 2b so as to introduce the cleaning gas into the FOUP 2.

In Step S005, the gas discharge part 20 of the load port device 10 discharges the gas in the FOUP 2 via the first bottom holes 5 in a state where the first bottom nozzles 21 are communicated with the first bottom holes 5 of the FOUP 2. Incidentally, when the communication state between the first bottom nozzles 21 and the first bottom holes 5 is released in Step S003 mentioned above, the bottom nozzles 21 are raised once again to communicate with the first bottom holes 5 in Step S005.

Furthermore, in Step S005, the load port device 10 can forcibly discharge the gas in the FOUP 2 by operating the forcible discharge means 24 of the gas discharge part 20. It is possible to select whether a forcible discharge is carried out or a spontaneous discharge where the gas in the FOUP 2 is pushed out from the first bottom holes 5 by the cleaning gas introduced from the main opening 2b is carried out depending upon kind or amount of an outgas that may occur from the wafers 1, the number of wafers 1 housed in the FOUP 2, and the like.

While the load port device 10 is carrying out the step shown in Step S005, the EFEM 50 shown in FIG. 1 operates an arm 54a of the transportation robot 54 so as to take out the wafers 1 before being processed and transport them to the processing room via the minienvironment 52. The EFEM 50 operates the arm 54a of the transportation robot 54 so as to transport the wafers 1 processed in the processing room to the FOUP 2 via the minienvironment 52.

After all of the processed wafers 1 are returned to the FOUP 2, the load port device 10 stops introducing the cleaning gas from the main opening 2b and discharging the gas from the first bottom holes 5 (Step S006). The load port device 10 stops introducing the cleaning gas from the main opening 2b by stopping blowing the cleaning gas from the blow nozzles 17a. The load port device 10 stops the discharge of the gas from the first bottom holes 5 by stopping the forcible discharge means 24 if a forcible discharge is carried out in Step S005. Incidentally, the load port device 10 stops the discharge of the gas from the first bottom holes 5 by stopping introducing the cleaning gas from the main opening 2b if a spontaneous discharge is carried out in Step S005.

In Step S007 (see FIG. 7), the opening and closing part 18 of the load port part 10 closes the main opening 2b of the FOUP 2. The load port device 10 moves the door 18a by the door driving part 18b shown in FIG. 5 and returns the lid 4 engaged with the door 18a to the first side surface 2d of the FOUP 2, so that the main opening 2b is closed. After the lid 4 closes the main opening 2b, the engagement between the door 18a and the lid 4 is released. After Step S007, the load port device 10 moves the installation stand 14 in the Y-axis direction (negative direction) so as to return the FOUP 2 housing the processed wafers 1 to the position of the installation step (Step S001) shown in FIG. 3.

In a state where the main opening 2b is opened, the load port device 10 introduces the cleaning gas from the main opening 2b of the FOUP 2 taking in and out the wafers 1 by the front gas introduction part 17, and connects the first bottom nozzles 21 of the gas discharge part 20 to the first bottom holes 5 distant from the main opening 2b so as to discharge the gas in the FOUP 2. This allows the load port device 10 to effectively discharge the outgas generated from the processed wafers 1 to the outside of the FOUP 2 also while the wafers 1 are being taken in and out via the main opening 2b. That is, the main opening 2b has a wide opening area, and thus can efficiently introduce the cleaning gas into the FOUP 2. The gas in the FOUP 2 is discharged from the first bottom holes 5 distant from the main opening 2b, and thus a current going from the main opening 2b to the first bottom holes 5 is formed in the entire inside of the FOUP 2 housing the wafers 1. Then, the current formed in the FOUP 2 passes near the surfaces of the wafers 1, which promotes the discharge of the outgas. This allows the load port device 10 to prevent a problem that the wafers 1 in the FOUP 2 are oxidized or contaminated due to the outgas generated from the processed wafers 1.

Incidentally, the first bottom holes 5 discharging the gas in the FOUP 2 are preferably formed at a position distant from the main opening 2b as much as possible in view of forming a current discharging the outgas in the entire inside of the FOUP 2. Thus, the distance from the first bottom holes 5 to the main opening 2b is preferably two thirds or more of diameters of the housed wafers 1, and is more preferably diameters or more of the wafers 1.

In the above-mentioned cleaning gas introducing method by the load port device 10, the first introduction step (STEP S003) of introducing the cleaning gas from the second bottom holes 6 of the FOUP 2 is carried out so as to clean the inside of the FOUP 2 and effectively protect the wafers 1 from oxidation and contamination even in a state where the main opening 2b is closed. The second introduction step (Step S005) of introducing the cleaning gas from the main opening 2b is carried out in a state where the introduction of the cleaning gas from the second bottom holes 6 is stopped, which increases the intake amount of the gas from the main opening 2b and forms a more favorable current for discharging the outgas in the entire inside of the FOUP 2.

In the load port device 10, the forcible discharge means 24 discharges the gas in the FOUP 2 so as to effectively introduce the cleaning gas from the main opening 2b, and the current is formed in the FOUP 2 so as to effectively discharge the outgas generated from the processed wafers 1.

Furthermore, in the above-mentioned load port device 10, the gas discharge part 20 having the first bottom nozzles 21 functions as a discharge passage for discharging the gas from the FOUP 2 in both the first introduction step (Step S003) of introducing the cleaning gas from the second bottom holes 6 and the second cleaning step (Step S005) of introducing the cleaning gas from the main opening 2b. Thus, the load port device 10 makes it possible to achieve two kinds of cleaning steps having different modes with a simple configuration.

Accordingly, the present invention is described by showing the embodiment, but the above-mentioned load port device 10 and cleaning gas introducing method into a container on the load port device 10 are just an embodiment of the present invention, and variations other than the embodiment are included within the technical scope of the present invention.

For example, in the load port device 10, the gas discharge part 20 has the two first bottom nozzles 21 capable of communicating with the two first bottom holes 5, but there is no limit to the number of the first bottom nozzles 21 owned by the gas discharge part 20, and there is no limit to the number of the first bottom holes 5 connectable to the first bottom nozzles 21. Also, there is no limit to the number of the second bottom nozzles 31 owned by the bottom gas introduction part 30, and there is no limit to the number of the second bottom holes 6 connectable to the second bottom nozzles 31.

One of the first bottom nozzles 21 owned by the gas discharge part 20 may be able to introduce the cleaning gas from the first bottom hole 5 in the cleaning gas introducing step of Step S002 (first introduction step), and may be able to discharge the gas in the FOUP 2 from the first bottom hole 5 in the cleaning gas introducing step of Step S005 (second introduction step). The gas discharge part having the first bottom nozzle 21 has a valve 142 (see FIG. 6) capable of switching a state where the first bottom nozzle 21 is connected to the first pipe part 22 and a state where the first bottom nozzle 21 is connected to the second pipe part 32. The load port device having the gas discharge part can increase the number of introduction passages of the cleaning gas in the first introduction step, and thus can quickly clean the inside of the FOUP 2 before the main opening 2b is opened. In addition, both the introduction of the gas into the FOUP 2 and the discharge of the gas from the FOUP 2 can be carried out by the same first bottom nozzle 21, and it is thus possible to reduce the number of bottom holes and bottom nozzles and simplify the structure of the FOUP and the load port device.

Figure 6:
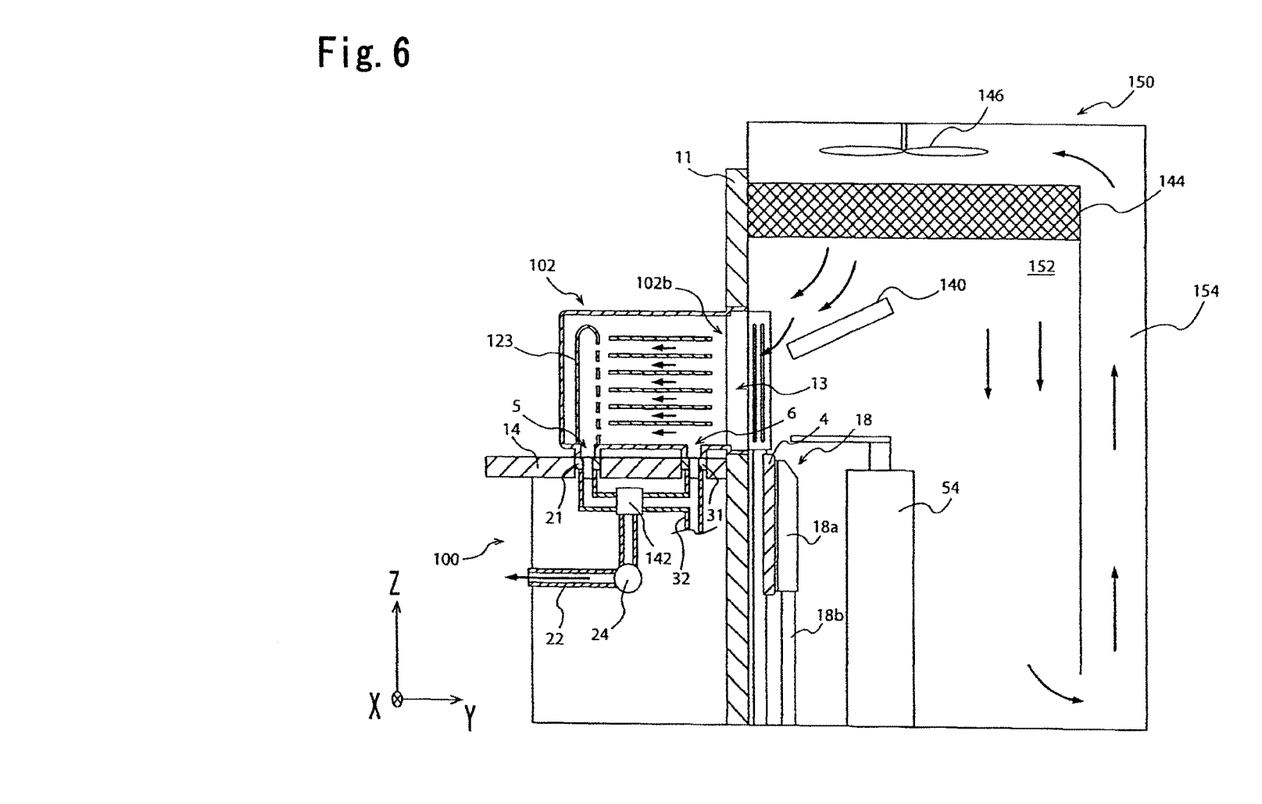
FIG. 6 is a conceptual figure showing a state of a load port device according to Second Embodiment.

FIG. 6 is a schematic cross sectional view showing an EFEM 150 having a load port device 100 according to another embodiment of the present invention. The EFEM 150 has a fan 146 and a filter 144. The fan 146 forms a downflow of a clean air in a minienvironment 152. The filter 144 is arranged above the minienvironment 152 and below the fan 146. In the EFEM 150, the fan 146 forms a current in the minienvironment 152 and a passage 154, and an air passes through the filter 144 and circulates, so that a clean state can be maintained in the minienvironment 152.

The load port device 100 has a current plate 140 configured to introduce the downflow of the clean air formed in the minienvironment 152 into a FOUP 102 via a main opening 102b of the FOUP 102. In a second introduction step (Step S005), the clean gas may be introduced using not only the front gas introduction part 17 having the blow nozzles 17a but the current plate 140 shown in FIG. 6.

In the second introduction step by the load port device 100, the gas is discharged from the inside of the FOUP 102 via a blow nozzle 123 standing upright from the first bottom holes 5 toward the inside of the FOUP 102 and formed intermittently or continuously in the Z-axis direction. In the second introduction, a current along the surfaces of the wafers 1 housed in the FOUP 102 is formed, and it is thus possible to effectively prevent a problem that the outgas generated from a certain wafer 1 contaminates the surfaces of other wafers 1 arranged in the up and down direction.

NUMERICAL REFERENCES

1 . . . wafer
2 . . . FOUP
2f . . . bottom surface
4 . . . lid
5 . . . first bottom hole
6 . . . second bottom hole
10, 100 . . . load port device
11 . . . wall member
14 . . . installation stand
17 . . . front gas introduction part
17a . . . blow nozzle
18 . . . opening and closing part
18a . . . door
20 . . . gas discharge part
21 . . . first bottom nozzle
22 . . . first pipe part
24 . . . forcible discharge means
30 . . . bottom gas introduction part 31 . . . second bottom nozzle
32 . . . second pipe part
140 . . . current plate
142 . . . valve
50, 150 . . . EFEM
52, 152 . . . minienvironment
"C" . . . bottom surface middle

The invention claimed is:

1. A cleaning gas introducing method into a container on a load port device, comprising:
   an installation step of installing the container whose side surface has a main opening for taking in and out a wafer on an installation stand of the load port device;
   a first introduction step of introducing a cleaning gas from at least one of bottom nozzles capable of communicating with a bottom hole formed on a bottom surface of the container installed on the installation stand in a state where the main opening is closed; and
   a second introduction step of introducing a cleaning gas from the main opening into the container after opening the main opening and stopping an introduction of the cleaning gas from the bottom nozzle,
   wherein the second introduction step discharges a gas in the container to an outside of the container via at least one of the bottom nozzles capable of communicating with a bottom hole formed at a position distant from the main opening more than a bottom surface middle on the bottom surface of the container.

2. The cleaning gas introducing method into a container on a load port device according to claim 1, wherein
   the bottom nozzle discharging the gas in the container to the outside of the container is connected to a forcible discharge means configured to forcibly discharge the gas in the container in the second introduction step, and
   the forcible discharge means forcibly discharges the gas in the container.

3. The cleaning gas introducing method into a container on a load port device according to claim 1, wherein
   the introduction of the cleaning gas in the first introduction step and the discharge of the gas in the second introduction step are carried out via the same bottom nozzle.

4. The cleaning gas introducing method into a container on a load port device according to claim 2, wherein
   the introduction of the cleaning gas in the first introduction step and the discharge of the gas in the second introduction step are carried out via the same bottom nozzle.

5. A load port device comprising:
   an installation stand configured to install a container having a main opening in a side of the container for taking in and out a wafer;
   a wall member separating the installation stand and a minienvironment, the wall member having a delivery port;
   an opening and closing part configured to open and close a lid of the main opening and the delivery port;
   a front gas introduction part arranged on an inner surface of the wall member on the side of the minienvironment and configured to introduce a first cleaning gas through the delivery port and the main opening opened by the opening and closing part into the container;
   a gas discharge part configured to have a first bottom nozzle capable of communicating with a first bottom hole in a bottom surface of the container, the first bottom hole being formed at a position distant from the main opening more than a bottom surface middle on a bottom surface of the container and configured to be capable of discharging a gas in the container to an outside of the container; and
   a bottom gas introduction part configured to introduce a second cleaning gas into the container from at least a second bottom nozzle configured to communicate with a second bottom hole formed in the bottom surface of the container;
   wherein the second bottom nozzle is located between the first bottom nozzle and the opening and closing part.

6. The load port device according to claim 5, wherein
   the gas discharge part comprises a forcible discharge means configured to forcibly discharge the gas in the container.

7. A load port device comprising:
   an installation stand configured to install a container having a main opening in a side of the container for taking in and out a wafer;
   a wall member separating the installation stand and a minienvironment, the wall member having a delivery port;
   an opening and closing part configured to open and close a lid of the main opening and the delivery port;
   a front gas introduction part arranged on an inner surface of the wall member on the side of the minienvironment and configured to introduce a first cleaning gas through the delivery port and the main opening opened by the opening and closing part into the container;
   a gas discharge part configured to have a first bottom nozzle capable of communicating with a first bottom hole in a bottom surface of the container, the first bottom hole being formed at a position distant from the main opening more than a bottom surface middle on a bottom surface of the container and configured to be capable of discharging a gas in the container to an outside of the container; and
   a bottom gas introduction part configured to introduce a second cleaning gas into the container from at least a second bottom nozzle configured to communicate with a second bottom hole formed in the bottom surface of the container;
   wherein the opening and closing part, the front gas introduction part, the gas discharge part and the bottom gas discharge part are located and configured to prevent gas from flowing from the container to the minienvironment when the lid of the main opening and the delivery port is open.

8. A load port device comprising:
   an installation stand configured to install a container having a main opening in a side of the container for taking in and out a wafer;
   a wall member separating the installation stand and a minienvironment, the wall member having a delivery port;
   an opening and closing part configured to open and close a lid of the main opening and the delivery port;
   a front gas introduction part arranged on an inner surface of the wall member on the side of the minienvironment and configured to introduce a first cleaning gas through the delivery port and the main opening opened by the opening and closing part into the container;
   a gas discharge part configured to have a first bottom nozzle capable of communicating with a first bottom hole in a bottom surface of the container, the first bottom hole being formed at a position distant from the main opening more than a bottom surface middle on a bottom surface of the container and configured to be capable of discharging a gas in the container to an outside of the container; and a bottom gas introduction part configured to introduce a second cleaning gas into the container from at least a second bottom nozzle configured to communicate with a second bottom hole formed in the bottom surface of the container;

wherein the load port device is configured to sequentially first introduce the second cleaning gas through the second bottom nozzle and then introduce the first cleaning gas through the front gas introduction part after cessation of the introduction of the second cleaning gas through the second bottom nozzle.

* * * * *